United States Patent
Liu

(10) Patent No.: US 6,640,884 B1
(45) Date of Patent: Nov. 4, 2003

(54) HEAT SINK FASTENER

(76) Inventor: Hung Tsi Liu, No. 29, Alley 3, Lane 240, Chung Hsing Rd., Long Tan Hsiang, Tao Yuan Hsien (TW)

( * ) Notice: Subject to any disclaimer, the term of this patent is extended or adjusted under 35 U.S.C. 154(b) by 0 days.

(21) Appl. No.: 10/265,730

(22) Filed: Oct. 8, 2002

(51) Int. Cl.⁷ .................................................. F28F 7/00
(52) U.S. Cl. ...................... 165/80.3; 165/185; 257/718; 257/719; 361/704; 361/707
(58) Field of Search ................ 165/80.3, 185, 165/67, 76; 257/718, 719, 722; 361/704, 707, 697, 709, 710, 711

(56) References Cited

U.S. PATENT DOCUMENTS

| | | | |
|---|---|---|---|
| 5,870,288 A | * 2/1999 | Chen ........................ | 361/704 |
| 5,881,800 A | * 3/1999 | Chung ...................... | 165/80.3 |
| 5,933,325 A | * 8/1999 | Hou ......................... | 361/704 |
| 6,049,457 A | * 4/2000 | Lee .......................... | 361/704 |
| 6,332,251 B1 | * 12/2001 | Ho et al. ................... | 165/80.3 |
| 6,450,249 B1 | * 9/2002 | Liu .......................... | 165/80.3 |
| 6,473,306 B2 | * 10/2002 | Koseki et al. ............. | 165/80.3 |
| 6,477,049 B1 | * 11/2002 | Lin .......................... | 361/704 |
| 6,501,657 B1 | * 12/2002 | Carr ......................... | 361/704 |
| 6,507,489 B1 | * 1/2003 | McGowan et al. ......... | 361/704 |
| 6,507,491 B1 | * 1/2003 | Chen ........................ | 361/697 |
| 6,510,054 B1 | * 1/2003 | Chen ........................ | 361/704 |
| 6,557,625 B1 | * 5/2003 | Ma ........................... | 361/704 |

* cited by examiner

*Primary Examiner*—Christopher Atkinson
(74) *Attorney, Agent, or Firm*—Bacon & Thomas PLLC

(57) ABSTRACT

A heat sink fastener for securing a heat sink to a CPU holder is constructed to include a stop plate fastened to a transverse groove of the heat sink, the stop plate having longitudinally and transversely extended end notches at the ends and a rectangular locating hole on the middle, a securement member, the securement member having two arched arms engaged into two vertical grooves of the heat sink, the arched arms each having a top notch, which receives one longitudinal end notch of the stop plate, a bottom locating hole, and a hooked end portion hooked in one hook hole of the CPU holder, a spring wire rod, the spring wire rod having two curved ends respectively hooked in the bottom locating holes of the arched arms of the elongated securement member, a U-shaped spring fastened to the rectangular locating hole of the stop plate and engaged into one groove of the heat sink, and a pressure plate fastened to one longitudinal end notch of the stop plate for pressing by the user to force the securement member away from the stop plate when unloading the head sink.

1 Claim, 7 Drawing Sheets

US 6,640,884 B1

HEAT SINK FASTENER

BACKGROUND OF THE INVENTION

1. Field of the Invention

The present invention relates to heat sink fastener adapted to secure a heat sink to a CPU holder and, more particularly, to such a heat sink fastener, which can easily be unfastened when unloading the heat sink.

2. Description of the Related Art

FIG. 1 illustrates the application of a heat sink fastener to secure a heat sink 3' to a CPU holder 2', keeping the heat sink 3' in close contact with the CPU in the CPU holder 2'. According to this design, the heat sink fastener is comprised of an angled clamping plate 11' and a vertical locking plate 12'. The angled clamping plate 11' has one hooked end 111' hooked in one of the two hook holes 21' of the CPU holder 2', and the other end pivoted to the vertical locking plate 12'. The vertical locking plate 12 has one end pivoted to the angled clamping plate 11', and the other end terminating in a hooked portion 121 hooked in the other of the two hook holes 21' of the CPU holder 2'. This structure of heat sink fastener is not satisfactory in function. When installed, the heat sink 3' may not be tightly maintained in contact with the surface of the CPU in the CPU holder 2'. Further, when unloading the heat sink 3', a special tool is needed to disengage the heat sink fastener from the CPU holder 2'.

SUMMARY OF THE INVENTION

The present invention has been accomplished to provide a heat sink fastener, which eliminates the aforesaid drawbacks. It is therefore one object of the present invention to provide heat sink fastener, which keeps the heat sink positively in close contact with the CPU when installed. It is another object of the present invention to provide a heat sink fastener, which can easily be unfastened. To achieve these and other objects of the present invention, the heat sink fastener comprises a narrow elongated stop plate adapted for engaging into one transversely extended groove of the heat sink, the stop plate having longitudinally and transversely extended end notches at two distal ends thereof and a rectangular locating hole on the middle, an elongated securement member, the securement member having two arched arms symmetrically provided at two distal ends thereof and adapted for engaging into two vertical grooves of the heat sink, the arched arms each having a top notch, which receives one longitudinal end notch of the stop plate, a bottom locating hole, and a distal end terminating in a hooked portion adapted for hooking in one hook hole of the CPU holder, a spring wire rod, the spring wire rod having two curved ends respectively hooked in the bottom locating holes of the arched arms of the elongated securement member, two torsional springs respectively mounted on the curved ends of the spring wire rod and stopped between the arched arms of the securement member and the spring wire rod, a pressure plate fastened to one longitudinal end notch of the stop plate and adapted for pressing by the user to force the securement member away from the stop plate, and a U-shaped spring fastened to the rectangular locating hole of the stop plate and adapted for engaging in one groove of the heat sink.

DETAILED DESCRIPTION OF THE PREFERRED EMBODIMENT

Figure 1:
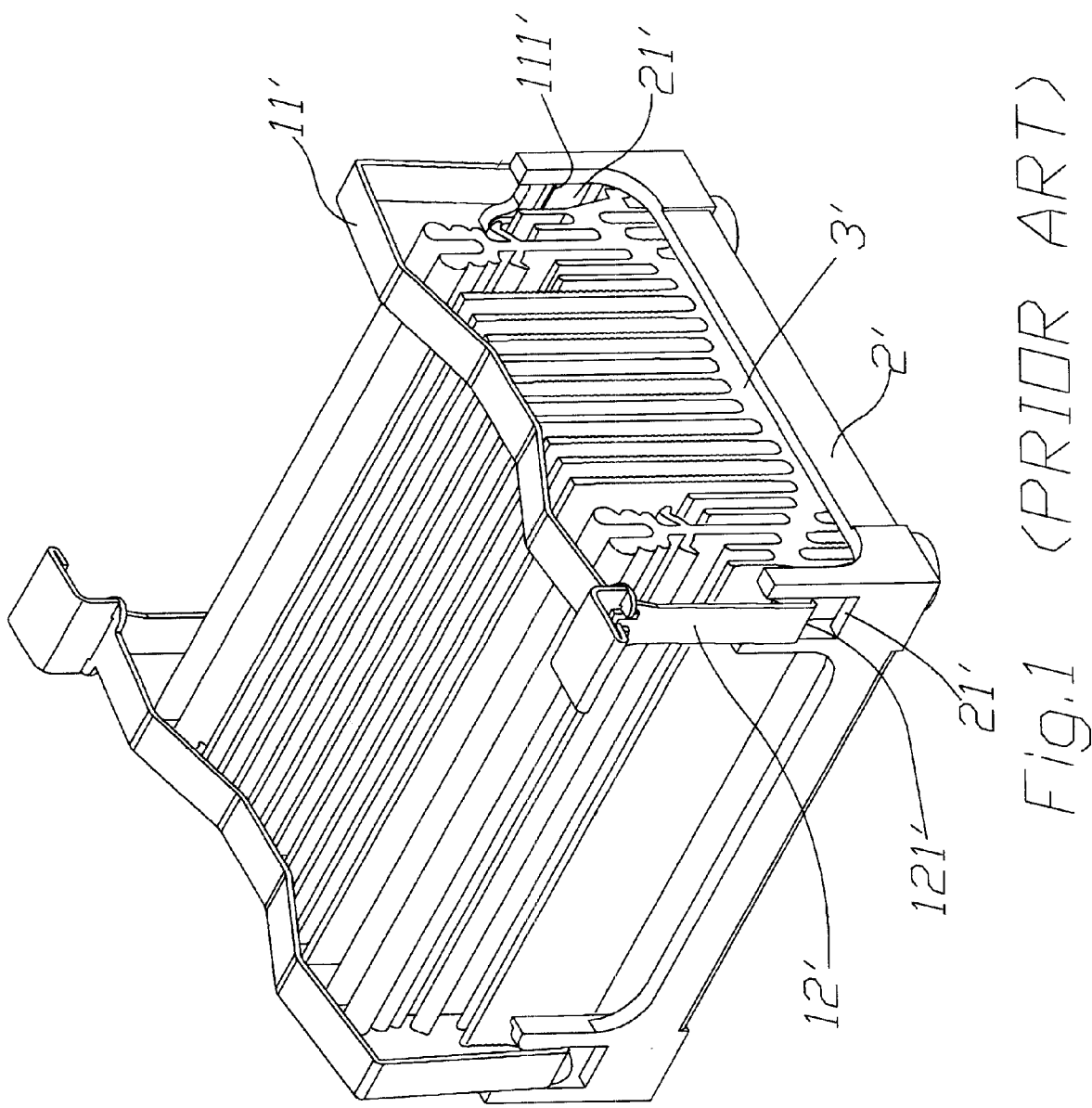
FIG. 1 is an applied view of the prior art design.
Figure 2:
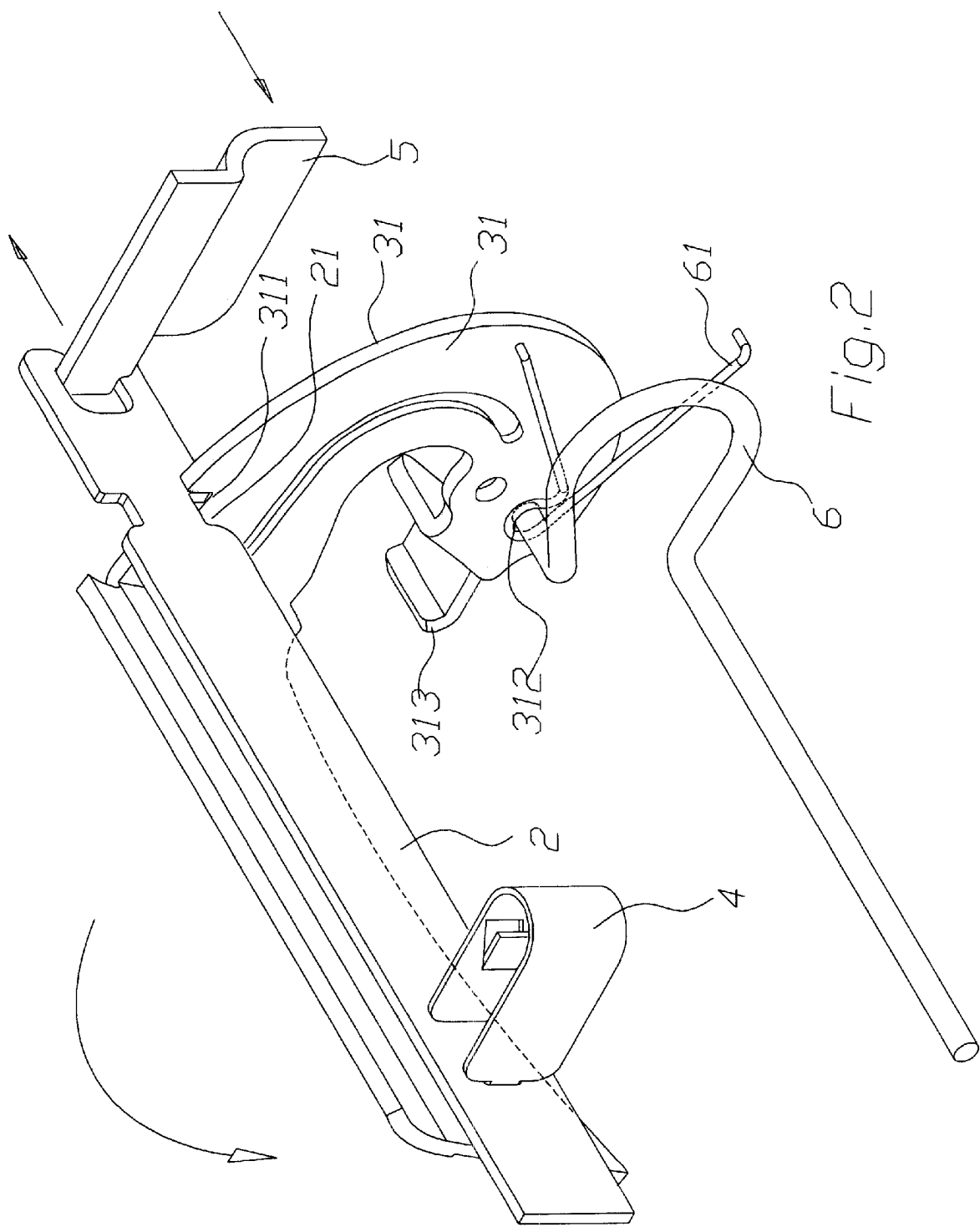
FIG. 2 is a perspective view of a part of the heat sink fastener according to the present invention.
Figure 3:
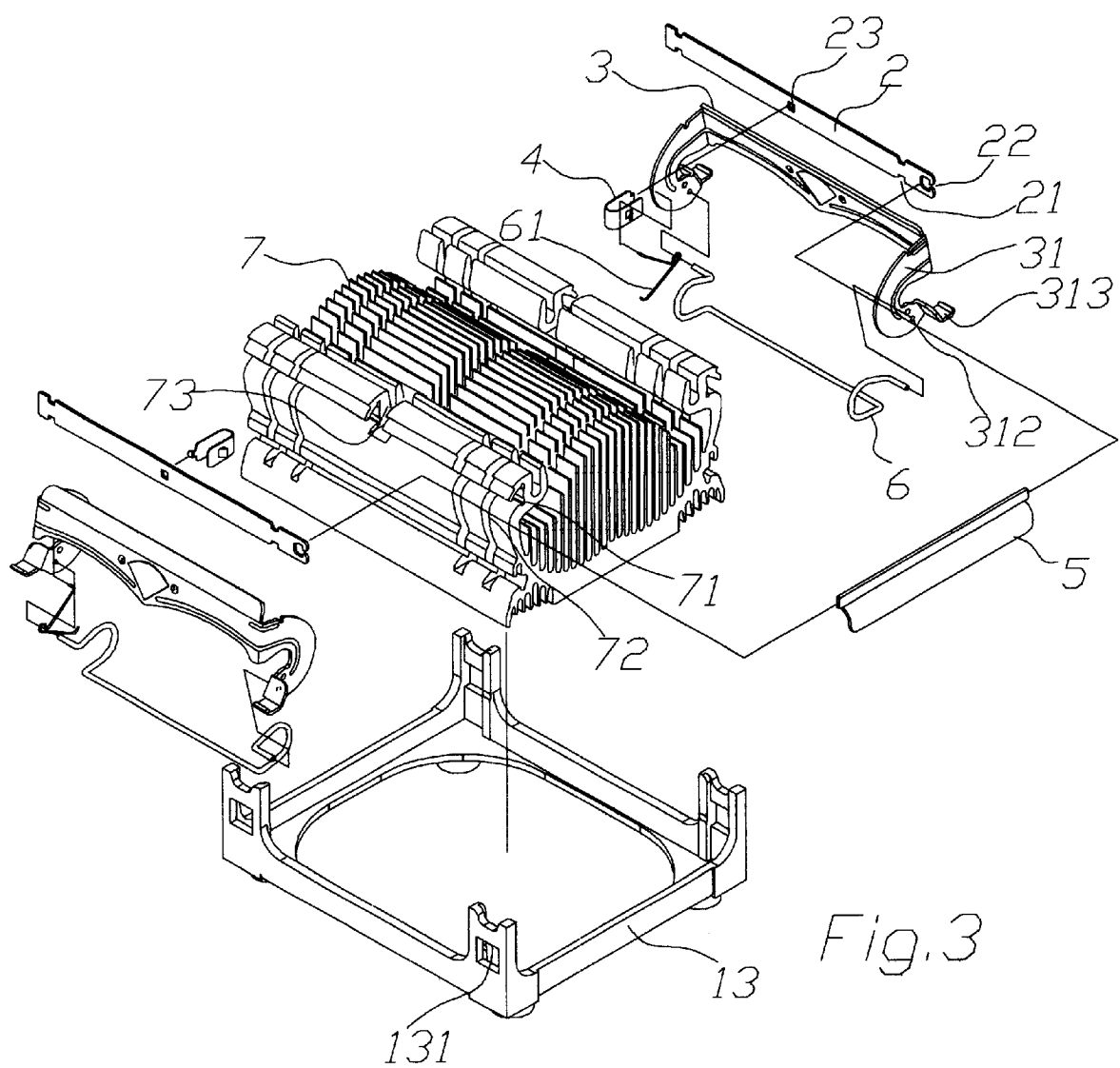
FIG. 3 is an exploded view showing the relationship between the heat sink fastener and the heat sink and CPU holder.
Figure 4:
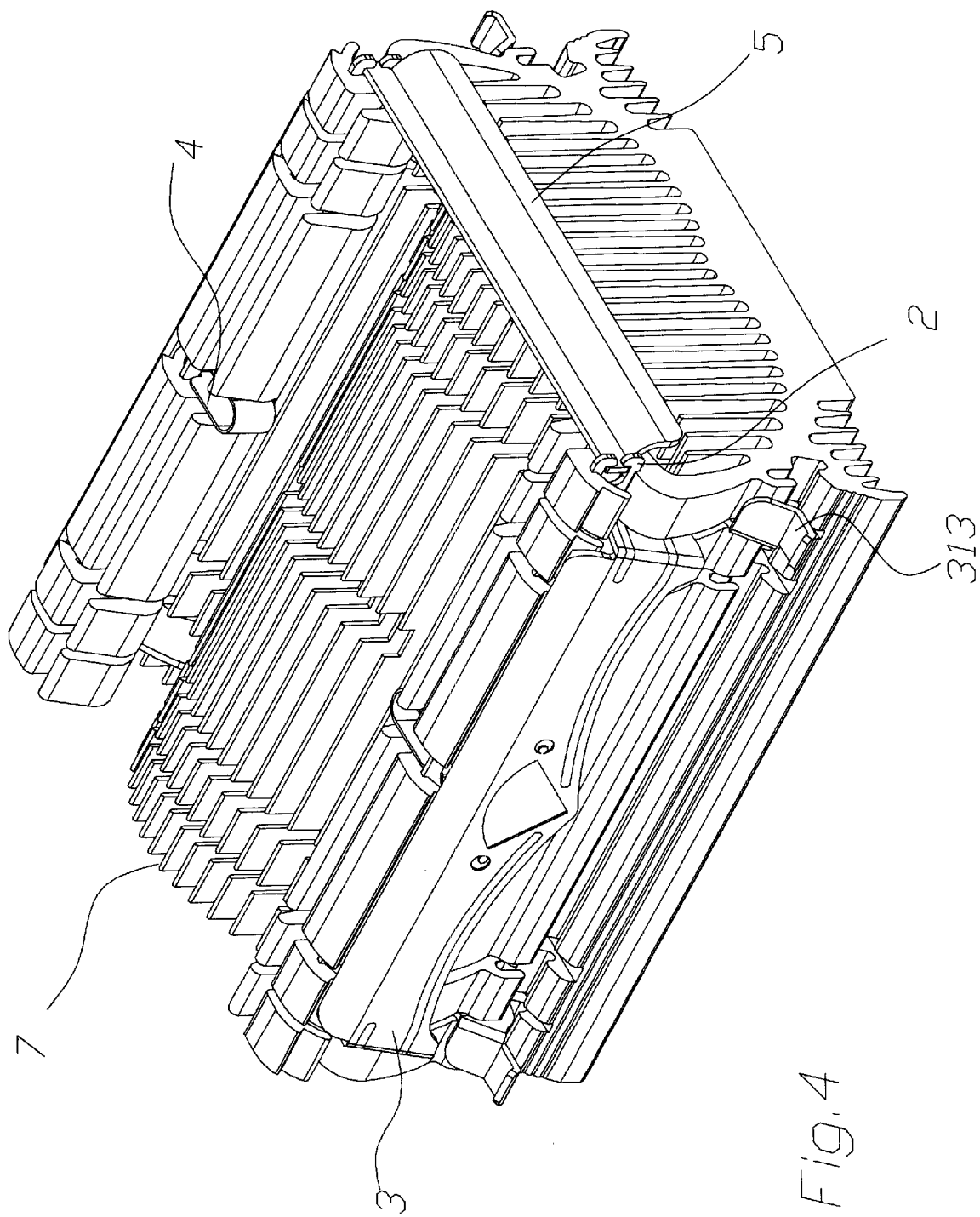
FIG. 4 is an assembly view of FIG. 3.

Referring to FIGS. 2–4, a heat sink fastener 100 is shown comprised of a stop plate 2, a securement member 3, a U-shaped spring plate 4, a pressure member 5, and a spring wire rod 6.

The stop plate 2 is a narrow elongated plate having longitudinally extended end notches 21 and transversely extended end notches 22 at the ends for receiving the securement member 3 and the pressure member 5, and a rectangular locating hole 23 on the middle for receiving the U-shaped spring plate 4.

The securement member 3 is an elongated member having two arched arms 31 symmetrically provided at the ends. The arched arms 31 each have a top notch 311, which receives one longitudinal end notch 21 of the stop plate 2, a bottom locating hole 312, which receives one curved end of the spring wire rod 6, and a distal end terminating in a hooked portion 313.

When fastening the heat sink fastener 100 to the heat sink 7, the stop plate 2 is engaged into one transverse groove 71 of the heat sink 7, and then the arched arms 31 of the securement member 3 are respectively hooked in respective vertical grooves 72 of the heat sink 7, and the U-shaped spring plate 4 is engaged into a middle groove 73 of the heat sink 7. When installed, the stop plate 2 holds down the securement member 3, thereby causing the hooked portions 313 of the securement member 3 to be respectively hooked in respective hook holes 131 of the CPU holder 13 to join the heat sink 7 and the CPU 13 firmly together. Further, two torsional springs 61 are respectively mounted on the curved ends of the spring wire rod 6 and stopped between the arched arms 31 of the securement member 3 and the spring wire rod 6 (in the drawings, only one torsional spring 61 is shown. When removing the heat sink fastener 100 from the heat sink 7, press the pressure member 5 to force the securement member 3 away from the stop plate 2.

Figure 5:
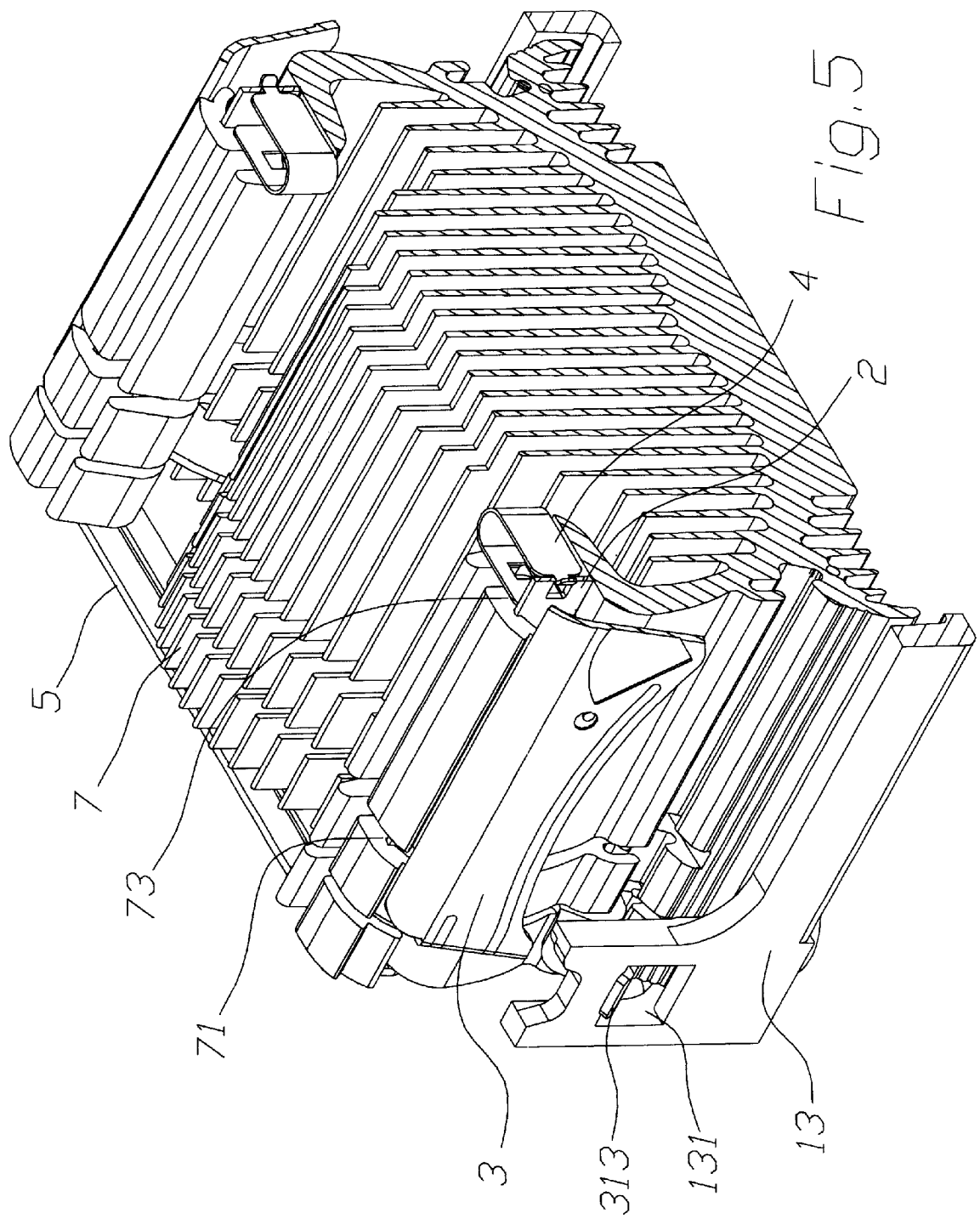
FIG. 5 is a sectional elevation in an enlarged scale of the assembly of FIG. 4.
Figure 6:
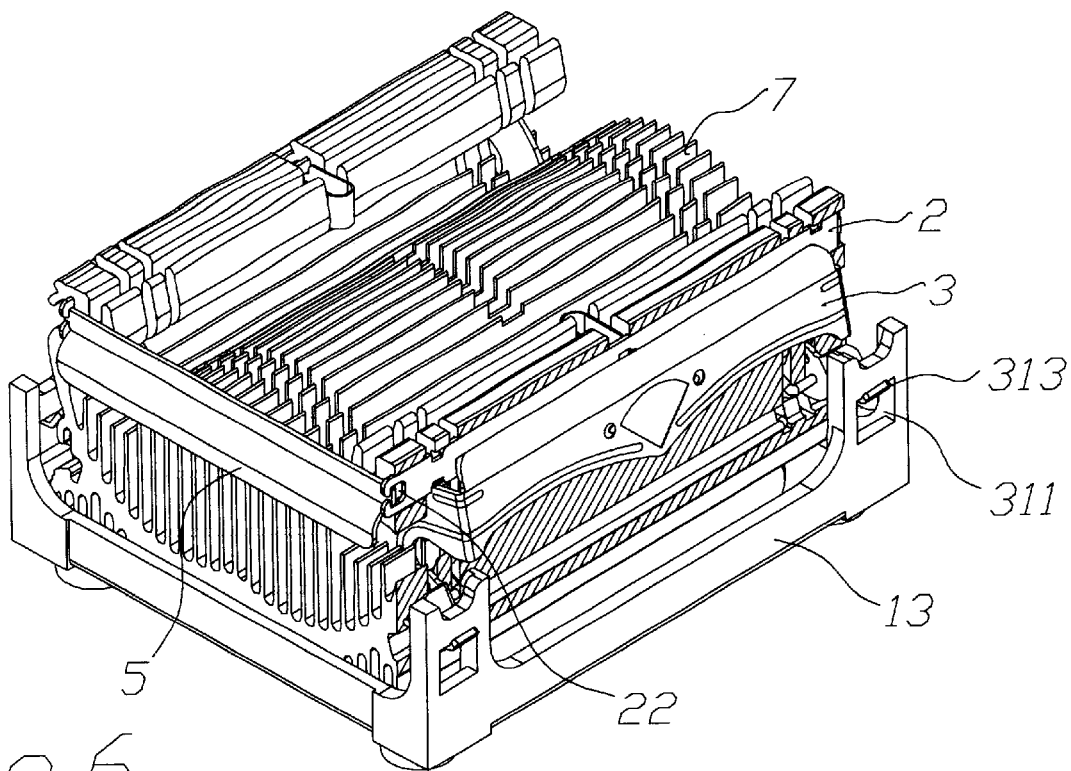
FIG. 6 is a schematic drawing showing the installation procedure of the present invention (I).
Figure 7:
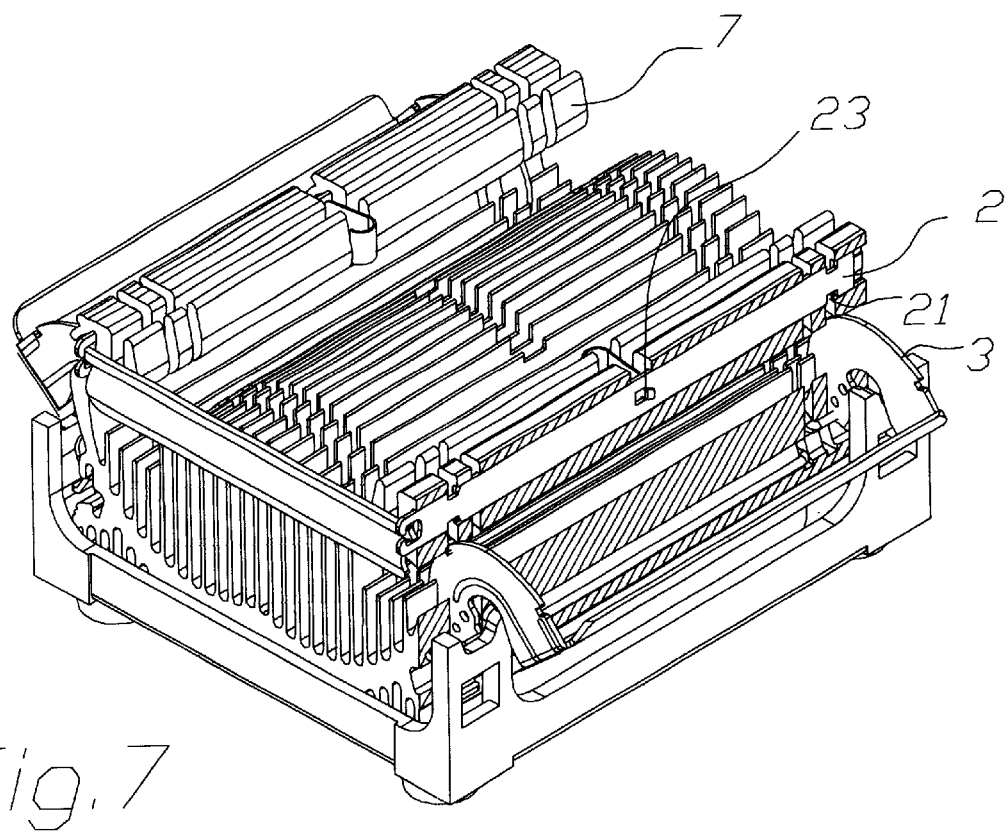
FIG. 7 is a schematic drawing showing the installation procedure of the present invention (II).
Figure 8:
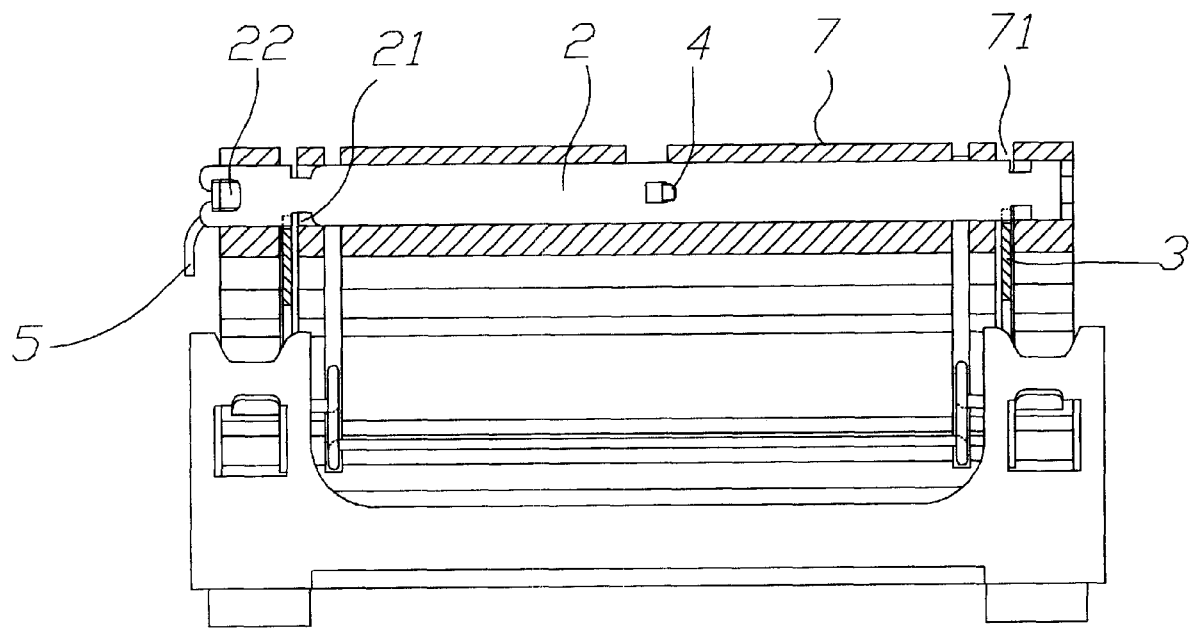
FIG. 8 is a sectional view of the present invention, showing the relative positioning between the stop plate and the securement member.
Figure 9:
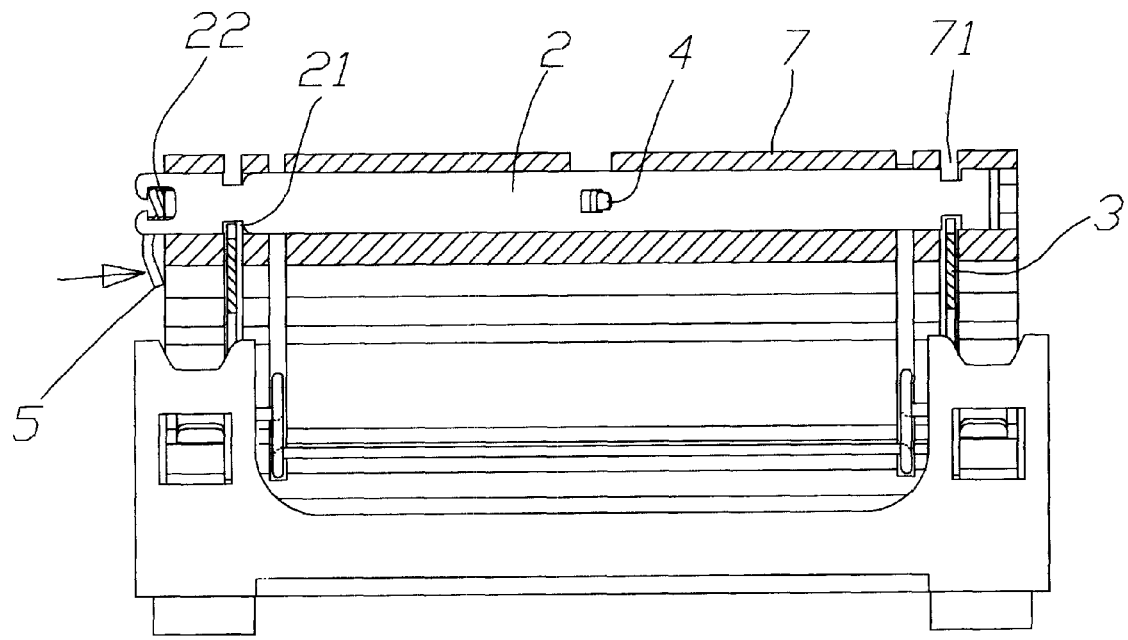
FIG. 9 is a schematic sectional view of the present invention, showing the pressure plate pressed, the securement member moved upwards into the longitudinally extended end notches of the stop plate.

Referring to FIG. 5, because the U-shaped spring plate 4 is maintained engaged in the middle groove 73 of the heat sink 7 after installation of the heat sink fastener 100 in the heat sink 7 and the CPU holder 13, the spring force of U-shaped spring plate 4 forces the stop plate 2 and the securement member 3 together, keeping the hooked portions 313 of the securement member 3 hooked in the hook holes 131 of the CPU holder 13.

Referring to FIGS. from 6 through 9, when installed, the stop plate 2 is forced by the spring wire rod 6 to push the securement member 3 upwards, thereby causing the hooked portions 313 of the arched arms 31 of the securement member 3 to be turned outwards and positively hooked in the hook holes 133 of the CPU holder 13. When unloading, the pressure plate 5 is pressed inwards to move the securement member 3 upwards into the longitudinally extended end notches 21 of the stop plate 2, thereby causing the securement member 3 to disengage the hooked portions 131 from the hook holes 131 of the CPU holder 13. At this time, the head sink 7 can easily be removed from the CPU holder 13.

A prototype of heat sink fastener has been constructed with the features of the annexed drawings of FIGS. 2~9. The heat sink fastener functions smoothly to provide all of the features discussed earlier.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A heat sink fastener for fastening a heat sink to a CPU holder to hold a CPU in said CPU holder in close contact with said heat sink, the heat sink fastener comprising:

a narrow elongated stop plate adapted for engaging into one transversely extended groove of said heat sink, said stop plate having longitudinally and transversely extended end notches at two distal ends thereof and a rectangular locating hole on the middle;

an elongated securement member, said securement member having two arched arms symmetrically provided at two distal ends thereof and adapted for engaging into two vertical grooves of said heat sink, said arched arms each having a top notch, which receives one longitudinal end notch of said stop plate, a bottom locating hole, and a distal end terminating in a hooked portion adapted for hooking in one hook hole of the CPU holder;

a spring wire rod, said spring wire rod having two curved ends respectively hooked in the bottom locating holes of said arched arms of said elongated securement member;

two torsional springs respectively mounted on the curved ends of said spring wire rod and stopped between said arched arms of said securement member and said spring wire rod;

a pressure plate fastened to one longitudinal end notch of said stop plate and adapted for pressing by the user to force said securement member away from said stop plate; and a U-shaped spring fastened to the rectangular locating hole of said stop plate and adapted for engaging in one groove of said heat sink.

* * * * *